United States Patent Office 3,651,170
Patented Mar. 21, 1972

3,651,170

ARTICLE ADAPTED TO BECOME A POSITIVE PLANOGRAPHIC PRINTING PLATE

Julius L. Silver, Manchester, Conn., assignor to Union Carbide Corporation, New York, N.Y.

No Drawing. Application May 14, 1968, Ser. No. 728,921, now Patent No. 3,514,288, which is a continuation-in-part of application Ser. No. 685,211, Nov. 22, 1967, which in turn is a continuation of application Ser. No. 406,901, Oct. 27, 1964. Divided and this application Feb. 4, 1970, Ser. No. 8,708
Int. Cl. C08g *37/18;* G03f *7/04*
U.S. Cl. 260—838 10 Claims

ABSTRACT OF THE DISCLOSURE

Article of commerce adapted to becoming a positive printing plate by the addition thereto of a photosensitive agent, said article comprising an oleophilic composition of an association product of a phenolic resin and an ethylene oxide polymer and a chromium trioxide component; and process for making such article.

This application is a division of U.S. application Ser. No. 728,921, filed May 14, 1968, which is a continuation-in-part of U.S. application Ser. No. 685,211, filed Nov. 22, 1967 which is a continuation of U.S. application Ser. No. 406,901, filed Oct. 27, 1964, said application Ser. No. 728,921 having issued as U.S. 3,514,288 and said applications Ser. Nos. 685,211 and 406,901 having been abandoned.

The invention relates to an article of commerce adapted to becoming a positive-working planographic printing-plate by the addition thereto of a photosensitive agent, and a process for making such article. More particularly, this invention relates to planographic printing plates based on association products of a phenolic resin and ethylene oxide polymers which are capable of printing images in either half-tone or continuous-tone. Areas of the plate receiving light do not print; areas receiving no light print. Tonal areas print in relationship to the amount of light received.

Positive-working plates can be exposed directly through photographic positive transparencies. Photographic negative transparencies as are used in the negative-working plates are not used unless it is desired to print negative images.

Continuous-tone printing plates are prepared by exposing the photosensitive printing plate to a continuous-tone photographic transparency. Half-tone printing plates are prepared by exposing the photosensitive printing plate to either a half-tone photographic transparency or to a contionuous-tone photographic transparency used with a half-tone contact screen.

In accordance with the present invention, an article of commerce is provided which is adapted to becoming a positive-working printing plate, which plate is capable of printing in either half-tone or continuous-tone. The resulting printing plate comprises a substance such as a metal, paper, plastic, and the like, having on its surface, as said article of commerce, a coating of an oleophilic composition. When suitably photosensitized and subsequently subjected to actinic radiation, this coating becomes hydrophilic in the areas struck by actinic radiation and in proportion to the amount of actinic radiation absorbed.

In a more particular aspect, the present invention provides as an article of commerce for use on a positive-working printing plate an oleophilic composition of an association product of a phenolic resin and an ethylene oxide polymer wherein the ethylene oxide polymer has a molecular weight of from 40,000 to ten million inclusive and is present in an amount of from 0.6 to 1.5 parts by weight per part phenolic resin and from 0.06 to 0.25 parts by weight per part phenolic resin of a chromium trioxide component.

The oleophilic composition of the present invention comprises an association product of a phenolic resin and an ethylene oxide polymer in admixture with chromium trioxide.

The ethylene oxide polymer component of this invention is selected from the resinous ethylene oxide polymeric materials having an average molecular weight in the range of from about 40,000 to about ten million, which are readily soluble in water. The term "ethylene oxide polymers" refers to polymers possessing the repeating unit ($CH_2$—$CH_2O$—) as represented by the class of commercial Polyox resins; and the term is intended to include water soluble ethylene oxide polymer resins wherein ethylene oxide is the predominant monomer polymerized therein but which can also contain polymerized residues of other olefin oxides as exemplified by copolymers and terpolymers of ethylene oxide with other copolymerizable monomers containing single epoxide groups such as propylene oxide, butylene oxide, styrene oxide and the like. Poly(ethylene oxide) homopolymer is however preferred as the ethylene oxide polymer resin and shall be used hereinafter as representative of these resins.

The phenolic resin components suitable in the present invention are the heat fusible condensation products of a phenol with an aldehyde. Such condensation products are divided into two classes, resoles and novolaks, either of which can be used in the compositions of this invention as shown hereinafter. These two types of resins are discussed in order below. Both of these classes of phenolic resins will form association products with ethylene oxide polymers.

While these phenolic resins are in the fusible form when making the association product (as hereinafter more clearly set forth) the fusible condition is not necessarily a critical condition of the association product, in which it is possible for a portion or all of the phenolic resin component be fully advanced to the cured state in the substrate.

The fusible resole phenolic resins can advance upon heating to a degree of cure and polymerization to attain a completely insoluble state. These insoluble phenolics cannot be used in the preparation of the present compositions but are believed to be present in the cured printing plate compositions of this invention. In the preparation of the present compositions only those heat fusible phenolic resins which are soluble in water, and/or organic solvents such as acetone, ethanol and the like or which are sufficiently fusible to permit admixture and association with the ethylene oxide polymers can be used. These resins include those resole phenolic resins which have not cured to a degree of insolubility as well as the novolak resins discussed below.

RESOLE RESINS

Resole resins, are generally produced by the condensation of phenols and aldehydes under alkaline conditions. Resoles differ from novolaks in that polynuclear methylol-substituted phenols are formed as intermediates in resoles. A resole produced by the condensation of phenol with formaldehyde most likely proceeds through an intermediate having the following illustrated type structure:

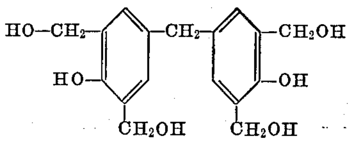

In a typical synthesis, resoles are prepared by heating one mole of phenol with 1.5 moles of formaldehyde under alkaline conditions.

The resole resins are prepared by the condensation of phenol with formaldehyde or, more generally, by the reaction of a phenolic compound, having two or three reactive aromatic ring hydrogen positions, with an aldehyde or aldehyde-liberating compound capable of undergoing phenol-aldehyde condensation. Illustrative of phenolic compounds are cresol, xylenol, ethylphenol, butylphenol, isopropylmethoxyphenol, chlorophenol, resorcinol, hydroquinone, naphthol, 2,2-bis(p-hydroxyphenyl) propane, and the like. Illustrative of aldehydes are formaldehyde, acetaldehyde, acrolein, crotonaldehyde, furfural, and the like. Illustrative of aldehyde-liberating compounds are for example, paraformaldehyde, formalin and 1,3,5-trioxane. Ketones such as acetone are also capable of condensing with phenolic compounds, as are agents such as hexamethylenetetramine.

The condensation of phenolic compound and aldehyde is conducted in the presence of alkaline reagents such as sodium carbonate, sodium acetate, sodium hydroxide, ammonium hydroxide, and the like. When the condensation reaction is completed, if desired, the water and other volatile materials can be removed by distillation, and the catalyst neutralized.

NOVOLAK RESINS

The novolak resins are prepared in a manner similar to that used to prepare the resole resins. The distinguishing exception in this preparation is however that the reaction is generally conducted in an acidic media, instead of an alkaline media as is the case with the resoles. When less than six moles of formaldehyde are used per seven moles of phenol the products are permanently fusible and soluble. These are the novolak resins. The novolaks have a different structure than the resoles as is illustrated by the novolak condensation products of phenol with formaldehyde.

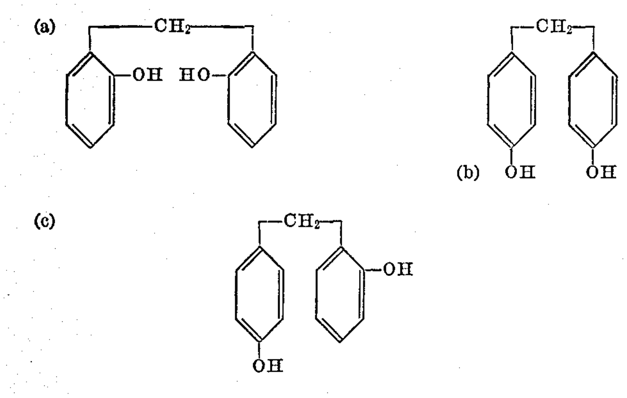

The novolaks can be further reacted with formaldehyde or with a compound such as hexamethylene tetramine, to a state of cure which is similar in the nature to the curing pattern of the resoles.

In a typical synthesis novolaks are prepared by heating one mole of phenol with 0.5 mole of formaldehyde under acidic conditions. The temperature at which the reaction is conducted is generally from about 25° C. to about 175° C.

The reactants which can be used in the preparation of the novolaks are the same as those used in the preparation of the resoles which are described and listed above.

While as previously stated, both the resole resins and the novolak resins can be employed in the substrate compositions of the present invention, it is preferred to use the "high 2,2′ novolak resins" since these resins yield more durable printing plates. These resins contain a high percentage of compounds having the structure

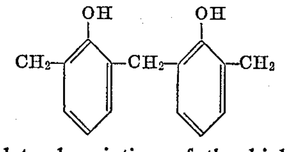

A more complete description of the high 2,2′ novolak resins and their preparation can be found in U.S. Pat. No. 2,475,587 which is hereby incorporated herein by reference.

In actual practice few phenolic resins are purely novolak or purely resole but rather have some degree of each characteristic. That is: most novolaks are slightly insolubilized by heat and most resoles are not completely insolubilized by heat. The high 2,2′ novolaks are more purely novolak than the ordinary type of novolaks. The resoles which are very rich in trimethylolphenol

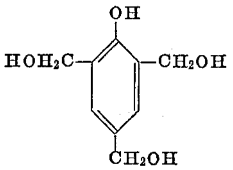

or in methylol groups are more purely resole in character than ordinary resoles. Consequently, because of these properties, various types of positive-working plates can be formulated in this invention which involve only resoles or only novolaks or a combination of both.

The chromium trioxide component ($CrO_3$) of this invention can be used directly as such or can be conveniently provided by a water soluble dichromate compound containing the ($CrO_3$) moiety. For example, dichromic acid for the purposes of this invention is defined as having the formula $H_2[CrO_3 \cdot CrO_4]$ and thus contains the chromium trioxide moiety. Similarly the alkali metal dichromate salts are defined as having the formula $$M_2[CrO_3 \cdot CrO_4]$$

which contain this moiety. For this reason the dichromate compounds are considered to provide chromium trioxide and are intended to be included within the definition of chromium trioxide. Suitable dichromates include dichromic acid, i.e. where M is $H^+$, $H_2^{++}[CrO_3 \cdot CrO_4]$ as well as the alkali metal dichromates, i.e. where M is an alkali metal ion. It should be noted that while ammonia ($NH_3$) is not, per se, an alkali metal, its radical $[NH_4]^+$ is frequently treated as a member of this group. For the purposes of this invention ammonia is considered to be a member of the alkali metals and it is intended that it be encompassed within the definition. The alkali metal dichromates include ammonium dichromate $$[NH_4]_2[CrO_3 \cdot CrO_4]$$

lithium dichromate $Li_2[CrO_3 \cdot CrO_4]$, sodium dichromate $Na_2[CrO_3 \cdot CrO_4]$, potassium dichromate $$K_2[CrO_3 \cdot CrO]_4$$

and the like.

All of these compositions conveniently provide chromium trioxide suitable for use in this invention.

The chromium trioxide component ($CrO_3$) is essential to the present invention since its absence causes the printing plate to print negative.

The quantity of the components in the oleophilic composition must be within specific limits in order to provide a printing plate capable of positive printing. The ethylene oxide polymer is used in an amount of from 0.6 to 1.5 parts by weight per part phenolic resin and preferably from 0.9 to 1.1 parts per part ethylene oxide polymer per part phenolic resin.

The chromium trioxide component ($CrO_3$) is used in an amount of from 0.06 to 0.25 parts by weight per part phenolic resin and preferably from 0.08 to 0.25 part per part phenolic resin.

It should be noted that chromium trioxide has a different effect on coatings of ethylene oxide polymer resins and resoles than on those of ethylene oxide polymer resins and novolaks when they are incorporated, followed by baking.

Ethylene oxide polymer resins and resoles when baked produce coatings which are insensitive to almost all solvents. When sensitized and exposed to actinic radiation the coatings are only slightly solubilized to water or solvents such as alcohols or ketones. However, if chromium trioxide is added prior to baking then the baked coatings are slightly solubilized to solvents and very solubilized to solvents after sensitization and exposure to actinic radiation.

If ethylene oxide polymer resins and novolaks are baked then the coatings are soluble to solvents whether sensitized and exposed or not. This is to be anticipated since novolaks are not cross-linkable by heat alone but require the presence of sources of labile formaldehyde which is supplied by additives such as hexamethylenetetramine. If the ethylene oxide polymer resin content is high enough the coatings are also water soluble to some extent.

If chromium trioxide is present then the above baked coatings become insensitive to water and other solvents but the sensitized and exposed areas become slightly soluble to water and other solvents. Thus the effect of chromium trioxide appears to have a cross-linking effect on novolaks and the effect of reducing the normal effect of heat on resoles which would ordinarily cause them to cross-link.

To illustrate:

resole + ethylene oxide polymer resins $\xrightarrow{\text{heat}}$ insoluble to solvents
resole + ethylene oxide polymer resins + chromium trioxide $\xrightarrow{\text{heat}}$ soluble in solvents novolak + ethylene oxide polymer resins $\xrightarrow{\text{heat}}$ soluble in solvents
novolak + ethylene oxide polymer resins + chromium trioxide $\xrightarrow{\text{heat}}$ insoluble in solvents Whether the positive-working plate is made with resole or with novolak resins, the coating must be oleophilic to start with. In the case of the novolaks the effect of chromium trioxide is to cause the coating to be insoluble and slightly soluble where sensitized and exposed. If the chromium trioxide is not used then the coating is quite soluble and after sensitization and exposure the entire coating is readily dissolved both in exposed and unexposed areas.

The coating solution is prepared by blending the phenolic resin component, the ethylene oxide polymer and the chromium trioxide component in any suitable blending device and in a suitable solvent such as dimethyl formamide.

The coating can be prepared as a self-supporting film or can be used as a coating on a suitable support. Suitable support materials include sheet metal and foil of such metals as copper, steel, aluminum, zinc and the like; paper, cloth, glass, plastic film and sheet such as polystyrene, polyethylene, polyvinyl chloride and the like. For practical purposes, the coating is generally applied in a thickness of from 0.10 mil to 5 mils.

The coating is then insolubilized or advanced to a degree such that it is insoluble in organic solvents of the type indicated above such as dimethyl formamide. This insolubilization is conveniently effected by heating the coating at a temperature and for a period of time sufficient to insolubilize it. Generally, heating for a period of from about 5 to about 30 minutes at a temperature of from about 120° C. to about 200° C. and preferably at a temperature of from about 140° C. to 180° C. will effect insolubilization of the substrate. After insolubilization by baking or other means, it can be photosensitized by application of the photosensitizer.

The photosensitive agents suitable in the practice of this invention are those which are capable of producing free radicals or ions on exposure to actinic radiation at ambient temperatures. These radicals or ions are those which will react with the association product of phenolic resin and poly-(ethylene oxide) resin to cause some solubilization thereof in water. These agents include dichromates, such as ammonium dichromate, sodium dichromate, potassium dichromate, and the like; diazonium salts, for example p-diazo-N,N-diethyl aniline zinc chloride; p-amino-N-benzyl-N-ethylbenzenediazonium chlorostannate; p-amino - N - ethyl-N-hydroxyethylbenzenediazonium chlorozincate, and the like; azido aromatics, such as the sodium salts of 4,4′-diazidostilbene-2,2′-disulfonic acid and di-(4-azido-2′-hydroxylbenzol)-acetone-2-sulfonic acid, and the like; and complexes of the transition metals such as those complexes formed by dissolving in a common solvent the transition metal salt such as ammonium molybdate along with a complexing ion such as citrate, tartrate and oxalate.

In addition to the aforementioned suitable photosensitizers, the photosensitive agent can also be compounds containing at least one halogen substituent exhibiting a molecular weight greater than 40, which is capable of releasing free halogen radicals when exposed to actinic radiation at ambient temperatures.

Included as suitable photosensitizing agents are both the inorganic photosensitizers and the organic photosensitizing agents containing bromine and/or iodine.

Illustrative of the inorganic halogen containing photosensitive agents are hydrogen iodide (HI), hydrogen bromide (HBr) and the like.

Illustrative of the organic photosensitive compounds containing at least one halogen substituent having a molecular weight in excess of 40 are the halogenated hydrocarbons such as the halogenated alkyls containing from one to eight carbon atoms, for example, methyl iodide, methyl bromide, diiodomethane, dibromidomethane, iodoform, bromoform, carbon tetraiodide, carbon tetrabromide, bromo ethane diiodoethane, triiodoethane, diiododibromo ethane, bromopropane, diiodopropane, triiodopropane, hexabromopropane, triiodopentane, tribromohexane, hexaiodo hexane, hexabromoheptane, hexabromo diiodooctane, triiodooctane and the like; the halogenated aryls such as hexaiodo benzene, hexabromo benzene, triiodomethyl benzene and the like; the halogenated alkanols containing from two to eight carbon atoms, such as diiodoethanol, tribromopropanol, triiodomethylpropanol, hexabromobutano, hexaiodohexanol, hexaiododibromoethanol and the like, halogenated alkyl aldehydes containing from two to eight carbon atoms inclusive, such as iodoacetaldehyde, dibromoacetaldehyde, triiodopropionaldehyde, tribromobutyraldehyde, triiodohexionaldehyde, tetrabromooctinal and the like; the halogenated carboxylic acids containing from two to eight carbon atoms such as tribromoacetic acid, triiodoacetic acid, dibromoacetic acid, triiodopropionic acid, bromopropionic acid, tetraiodobutyric acid, bromochloropentanoic acid, triiodofluorohexanoic acid, triiodotribromooctanoic acid, and the like; halogenated ketones such as containing from two to fourteen carbon atoms, iodoacetone, tribromoacetone, hexaiodoacetone, iodomethylethylketone, tetraiododiethylketone, hexaiodobutylpropylketone, iodobenzophenone, bromobenzophenone, iodomethylphenone, triiodoethylphenone, hexabromodiethylbenzophenone, and the like.

The photosensitizing ability of the various alkane iodides or bromides is a function of quantum yield,[1] which in turn depends on the chemical structure of the respective iodides or bromides. Generally, the quantum

[1] Quantum yield refers to the number of molecules reacting chemically per photon of light absorbed.

yield increases as the number of halogen atoms in the compounds increases, and as the length of the hydrocarbon chain increases. The quantum yield is also higher if the iodine atoms are on a tertiary carbon atom rather than a primary or secondary carbon atom. On this basis, the photosensitizing ability of various iodides, in the order of increasing efficiency, is exemplified by the following sequence:

$$CH_3I, CH_3CH_2I, CH_3(CH)_2I, CH_3(CH_2)_3I, (CH_3)_3CICH_2I_2, CHI_3$$

Iodoform is a particularly outstanding photosensitizing agent in the practice of the present invention.

The quantity of the photosensitizer used in the photosensitive coating should be in an amount sufficient to render the composition photosensitive to light energy. The specific amount necessary to effect the photosensitization desired is dependent upon such factors as the photosensitivity of the particular photosensitive component used, the photoresponse desired in relation to a given light source and other such factors.

Generally, a photosensitizing solution of from about 0.1 percent to about 5 percent by weight of photosensitizing agent is suitable for the purposes of this invention.

The photosensitizing agent is applied in solution form consisting of the photosensitizing agent in a suitable solvent therefor. Suitable solvents are those which readily dissolve the photosensitizing agent. Illustrative of suitable solvents for the photosensitizing agents are water, acetone, methanol, methyl ethyl ketone, diethyl ketone, methyl isobutyl ketone, Cellosolve, dioxane, dimethyl formamide and the like.

The photosensitizing solution can be applied to the oleophilic composition by any convenient coating means known to the art such as knife coating, roll coating, brush coating, spray coating, whirl coating and the like.

After the oleophilic substrate has been coated or imbibed with the photosensitive solution, the coating is allowed to dry for a period of time sufficient to volatilize the solvent. After the coating is dry the plate is photosensitive to actinic radiation such as light energy and particularly in the ultra range.

As a variation of the procedure of this invention the poly(ethylene oxide) resin, phenolic resin and chromic acid coating can be formulated with less phenolic resin so as to produce a hydrophilic plate. The additional phenolic resin needed to make the coating oleophilic can be included in the photosensitizing solution. The final plate is then oleophilic and photosensitive.

The photosensitive printing plate is exposed to light through a positive photographic transparency.

This transparency can be either the half-tone or the continuous-tone type. The actinic radiation can be generated by sunlight, carbon arc light, mercury vapor light or other light source of suitable intensity.

After exposure the plates are washed with water. The plate is then mounted on a standard offset printing press. Those areas of the plate which have not received light are oleophilic and will receive ink. Those areas of the plate which have received light will not accept ink. This plate therefore provides positive prints from a positive photographic transparency.

The mechanism of the photoreactions taking place are not known. It is observed that the photosensitized coatings of poly(ethylene oxide) resin, phenolic resin and chromium trioxide become progressively more hydrophilic as exposure to actinic radiation continues. It is also observed that the coating becomes progressively more water soluble with continued exposure. It is presumed that oleophilic components of the coating are modified so as to become solubilized and removable with water as a result of exposure. The exposure can be stopped at a point where the exposed areas are only slightly solubilized but sufficiently hydrophilic as to allow printing free of scum or toning in the non-image areas. The printing is thus done on an all-plastic surface and the substrate carrying the coating need not be hydrophilic. However the exposure can be prolonged to the point where the exposed areas of the coating are completely solubilized. In this case the substrate is uncovered and must therefore be either hydrophilic or easily wettable with water. Such substrate may be treated aluminum.

If the chromium trioxide is omitted in preparation of the coating then the photosensitized plate on exposure to actinic radiation shows only very slight solubilization to water with even prolonged exposure. The plate does not become progressively hydrophilic but rather becomes more and more oleophilic in character.

While not wishing to be bound by any theory of mechanisms, it is believed that the outsanding characteristics of the photosensitive compositions of the present invention as employed in the preparation and use of half-tone and continuous tone planographic printing plates are mainly due to the "association" or "complex" formation between the phenolic resin component and the ethylene oxide component. The term "association" refers to the interaction which provides the binding force between the poly(ethylene oxide) compound and the phenolic resin component. It is believed that the interaction involves one or more diverse mechanisms such as hydrogen bonding, electrostatic bonding, secondary valence forces, and the like. It appears that the phenomenon concerning hydrogen bonding can best explain the nature of the interaction. The "associating" or "complexing" interaction between the phenolic resin component and the ethylene oxide polymer component in the photosensitive compositions might be visualized in the following manner:

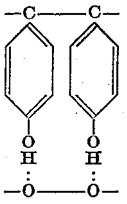

The "association" of the phenolic resin component and the ethylene oxide polymer component causes the formation of a tough, hydrophilic material.

The illustrations and examples which follow serve to illustrate this invention.

ILLUSTRATION I

This illustration exemplifies the preparation of conventional phenolic resins useful in the practice of the present invention.

(a) Phenol-formaldehyde resole resin

A mixture consisting of 1 mole of phenol, 3 moles of paraformaldehyde, 6 moles of water and 0.3 mole of sodium acetate trihydrate is refluxed at atmospheric pressure for a period of time between about two and one-half hours and three and one-half hours until the solution becomes cloudy. Two distinct phases begin to form as the resin precipitates from the refluxing mixture. Heating is continued for an additional five minutes and the hot mixture is then poured into water to completely precipitate the resin. The solid resin is recovered by filtration or decantation or other suitable separation method and washed thoroughly with water. The resin is dissolved in a suitable solvent such as methyl ethyl ketone, and anhydrous sodium sulfate is added to dry the solution. The water free solution is recovered by filtering out the sodium sulfate.

(b) Meta-cresol-formaldehyde resole resin

Meta-cresol, paraformaldehyde and sodium acetate trihydrate in a molar ratio of 1:2.5:0.3, respectively, are mixed in water to form a dilute slurry (about 200 milliliters of water per mole of meta-cresol). This mixture is refluxed at atmospheric pressure until resin begins to precipitate, which is normally about a twenty-minute reaction period. The heating is continued an additional five minutes, and the reaction mixture is poured into cold water to completely precipitate the resin. An anhydrous solution of the resin in methyl ethyl ketone is prepared in the same manner as above.

(c) Resorcinol-formaldehyde resole resin

A mixture of resorcinol, sodium sulfate and formalin (37 percent solution of formaldehyde in water) in a molar ratio of about 1:0.2:0.8, respectively, is dissolved in water (about 100 milliliters of water per mole of resorcinol). The reaction mixture is heated on a steam bath until the solution turns cloudy, then it is poured into cold water to completely precipitate the resin product. The resin is recovered and prepared as an anhydrous solution in methyl ethyl ketone in the manner described above.

(d) Phenol-formaldehyde novolak resin

One hundred grams of phenol is dissolved in 69 grams of 37 percent formalin solution and about 0.55 grams of oxalic acid is added. This mixture is refluxed at a temperature of about 80° C. for a period of about 6 hours at the end of which period the solution becomes cloudy. Water is then distilled from the reaction mixture until the temperature of the resinous mass reaches about 150° C. The resin is then discharged from the reaction vessel and allowed to cool. At room temperature the cooled resin is brittle and is readily pulverized to a powdery state.

EXAMPLE 1

Twelve grams of a water soluble ethylene oxide homopolymer having a molecular weight between 2 and 3 million, eight grams of a high 2,2′ novolak phenolformaldehyde resin are dissolved in six hundred milliliters of N,N-dimethyl formamide with the aid of a high speed vortex blender. When the solution is at room temperature one and one half grams of chromium trioxide and three grams of high 2,2′ novolak resin are added and the mixture blended further to obtain complete solubility. Enough N,N-dimethyl formamide is added to obtain a final viscosity at room temperature of about 2500 cps.

The solution is used to coat aluminum plates which are baked for 5 minutes at 160° C.

A photosensitizing solution is made by dissolving enough p-diazo-N,N-diethylaniline zinc chloride in methanol to make a 2 percent solution.

The printing plate is rinsed with the sensitizing solution and the solvent is allowed to evaporate off to leave a dry plate.

A photographic positive transparency which is screened (i.e. a positive half-tone subject) is placed on the plate and exposed for 5 seconds to a 21 ampere carbon arc light at a distance of two feet.

The exposed plate is washed with water to remove the residual photosensitizer and a small amount of coating in exposed areas. It is then mounted on a standard offset printing press to produce positive prints of excellent quality. Printing is from an all-plastic surface.

EXAMPLE 2

To obtain plates which are improved in durability hexamethylenetetramine is added in the initial steps of preparing the coating solution. The additive causes the phenolic resin in the final coating to be more highly cross-linked and thus produce a tougher coating.

The procedure is identical as in Example 1 except that two grams of hexamethylenetetramine are added along with the 12 grams of ethylene oxide polymer and 8 grams of high 2,2′ novolak resin.

As a variation the coating can be made such that when exposed to actinic radiation the exposed areas will become totally soluble in water and can be removed so that the substrate is exposed. Under these conditions the substrate must be either hydrophilic per se or easily rendered hydrophilic such as if the substrate is aluminum and is subsequently treated with gum arabic.

These coatings can be made with a larger proportion of ethylene oxide polymer so as to be hydrophilic and preferably with a resole resin. The chromium trioxide is also used. These hydrophilic coatings are made oleophilic and sensitized in one step by imbiding both additional phenolic resin as well as sensitizer.

EXAMPLE 3

Sixteen grams of a water soluble ethylene oxide homopolymer having a molecular weight between 2 and 3 million, eight grams of a resole phenolic resin condensation product of phenol and formaldehyde, and one gram of chromium trioxide are dissolved in six hundred milliliters of N,N-dimethyl formamide with the aid of a high speed vortex blender.

The solution is used to coat aluminum plates which are then dried and baked for a period of 20 minutes at a temperature of 160° C.

This coating is then treated with an acetone solution containing one percent resole phenol resin and one-half percent iodoform. The acetone evaporated from the coating leaving a smooth non-tacky finish.

A photographic positive transparency is placed on the plate and exposed for a period of two minutes to a 21 ampere carbon arc light at a distance of two feet.

The exposed plate is washed with water which removes the coating in the non-image areas. The plate is mounted on a standard offset printing press and positive prints of excellent quality are obtained.

EXAMPLE 4

To 300 milliliters of N,N-dimethylformamide is added 12 grams of ethylene oxide polymer having a molecular weight between 2 and 3 million, 6 grams of a resole which is over 70 percent by weight trimethylolphenol and 2 grams of a novolak which is a condensation product of nonylphenol and formaldehyde. After dissolving in a blender the solution is cooled and 1.5 grams of chromium trioxide is dissolved in. Enough solvent is added to give a solution of a viscosity of 1500 cps. Coatings are made on an aluminum support and baked 5 minutes at 160° C. The plate is sensitized by imbibing a solution which is 0.5 percent of p-diazo-m-methyldiethylaniline zinc chloride in water. After exposure to a positive transparency for 1 minute the plate is used to print with excellent results. The exposed areas only wash out slightly.

In this case the plate is oleophilic before sensitization and exposure even though the phenolic resin content is relatively low. The reason for the oleophilicity is due to the use of the nonylphenol resin. Such resins are unusually oleophilic due to the nonyl group.

This illustrates a means of varying the formulation by resin type.

EXAMPLE 5

A solution is made with 12 parts by weight ethylene oxide polymer, 3 parts by weight of a resole phenolic resin, 3 parts by weight of a resole resin which is very rich in trimethylolphenol and 2 parts by weight of a resole which is a nonylphenolformaldehyde resin. To the solution was added 1.5 parts by weight of chromium trioxide and coatings made the usual way. The sensitized and exposed plates gave excellent copy on an offset press.

The exposed areas are only slightly soluble and printing is done from a plastic surface both in image and non-image areas.

In the foregoing examples both half-tone and continuous-tone positive working printing plates are prepared. Half-tone plates are exposed through screened photographic transparencies. Continuous-tone plates are exposed through continuous-tone photographic transparencies.

What is claimed is:

1. An article of commerce adapted to becoming a positive printing plate by the addition thereto of a photosensitive agent, said agent being capable of producing free radicals or ions on exposure to actinic radiation at ambient temperatures, which comprises an insoluble oleophilic product of the interaction, in the presence of chromium trioxide component, of phenolic resin which is a heat fusible condensation product of a phenol and an aldehyde or a ketone and an ethylene oxide polymer having a molecular weight of from 40,000 to ten million, said ethylene oxide polymer being present in said oleophilic product in an amount of from 0.6 to 1.5 parts by weight per part of said phenolic resin, and said chromium trioxide component being present in said oleophilic product in an amount of 0.06 to 0.25 part by weight per part of said phenolic resin.

2. A process of froming an article of commerce, which article is adapted to becoming a positive printing plate by the addition thereto of a photosensitive agent, said agent being capable of producing free radicals or ions on exposure to actinic radiation at ambient temperatures, which comprises interacting a phenolic resin which is a heat fusible condensation product of a phenol and an aldehyde or a ketone with from 0.6 to 1.5 parts by weight, per part of said phenolic resin, of an ethylene oxide polymer having a molecular weight of from 40,000 to ten million in the presence of from 0.06 to 0.25 part by weight, per part of said phenolic resin, of chromium trioxide component and then insolubilizing the resulting interaction product by heating to form said article of commerce.

3. A process as in claim 2 in which said article of commerce is formed from a solution of the components thereof.

4. A process as in claim 3 in which the solvent employed in said solution is dimethyl formamide.

5. An article of commerce as in claim 1 in which said ethylene oxide polymer is a homopolymer.

6. An article of commerce as in claim 5 in which said ethylene oxide polymer has a molecular weight of about 2 to 3 million.

7. An article of commerce as in claim 6 in which said phenolic resin comprises novolak resin.

8. An article of commerce as in claim 6 in which said phenolic resin comprises resole resin.

9. A process as in claim 2 in which said ethylene oxide polymer is a homopolymer.

10. A process as in claim 9 in which said phenolic resin comprises resole resin.

References Cited

UNITED STATES PATENTS

| | | | |
|---|---|---|---|
| 3,231,382 | 1/1966 | Silver | 260—838 |
| 3,309,202 | 3/1967 | Silver | 260—838 |
| 3,074,897 | 1/1963 | Bradbury | 260—838 |

JOHN C. BLEUTGE, Primary Examiner

U.S. Cl. X.R.

96—33, 36.3, 88, 93; 117—132 A, 138.8 A; 260—823

PO-1050
(5/69)

UNITED STATES PATENT OFFICE
CERTIFICATE OF CORRECTION

Patent No. 3,651,170 Dated March 21, 1972

Inventor(s) J. L. Silver

It is certified that error appears in the above-identified patent and that said Letters Patent are hereby corrected as shown below:

Column 5, lines 35 to 44 should read
--resole + ethylene oxide polymer resins $\xrightarrow{\text{heat}}$ insoluble to solvents resole + ethylene oxide polymer resins + chromium trioxide $\xrightarrow{\text{heat}}$ soluble in solvents novolak + ethylene oxide polymer resins $\xrightarrow{\text{heat}}$ soluble in solvents novolak + ethylene oxide polymer resins + chromium trioxide $\xrightarrow{\text{heat}}$ insoluble in solvents--.

Column 6, line 52, "bromobutano" should read --bromobutanol--.

Column 7, lines 9 and 10 should read
-- $CH_3I$, $CH_3CH_2I$, $CH_3(CH_2)_2I$, $CH_3(CH_2)_3I$, $(CH_3)_3CI$, $CH_2I_2$, $CHI_3$.--

Column 7, line 42 --violet-- should be inserted after "ultra"

Column 11, line 18, "froming" should read --forming--.

Signed and sealed this 25th day of July 1972.

(SEAL)
Attest:

EDWARD M.FLETCHER,JR.
Attesting Officer

ROBERT GOTTSCHALK
Commissioner of Patents